United States Patent [19]

Fujii

[11] Patent Number: 5,467,462
[45] Date of Patent: Nov. 14, 1995

[54] EVENT DRIVEN LOGIC SIMULATOR FOR PARTIAL SIMULATION

[75] Inventor: Toshiaki Fujii, Tokyo, Japan

[73] Assignee: NEC Corporation, Japan

[21] Appl. No.: 930,013

[22] Filed: Aug. 14, 1992

[30] Foreign Application Priority Data

Aug. 14, 1991 [JP] Japan .................................. 3-228609

[51] Int. Cl.$^6$ .................................................. G06F 9/455
[52] U.S. Cl. .................... 364/578; 364/488; 364/221.2; 364/232.3; 364/DIG. 1; 395/183.15
[58] Field of Search .......................... 395/500; 364/488, 364/489, 490, 491, 578; 371/23

[56] References Cited

U.S. PATENT DOCUMENTS

| | | | |
|---|---|---|---|
| 4,942,615 | 7/1990 | Hirose | 364/578 |
| 4,965,743 | 10/1990 | Malin et al. | 395/50 |
| 5,018,089 | 5/1991 | Kanazawa | 364/578 |
| 5,068,812 | 11/1991 | Schaefer et al. | 364/578 |
| 5,184,308 | 2/1993 | Nagai et al. | 364/489 |
| 5,220,512 | 6/1993 | Watkins et al. | 364/489 |
| 5,327,361 | 7/1994 | Long et al. | 364/578 |

OTHER PUBLICATIONS

"Demand Driven Simulation; Backsim"; S. Smith et al., in Proc. 24th ACM/IEEE Design Automation Conference, pp. 181–187 (May, 1987).

Primary Examiner—Thomas G. Black
Assistant Examiner—Paul Harrity
Attorney, Agent, or Firm—Ostrolenk, Faber, Gerb & Soffen

[57] ABSTRACT

Event driven logic simulator for partial simulation is provided. An event storage has an event attribute storage section for indicating whether an event is preset before the execution of simulation by the operator. The node information storage has an event propagation flag storage indicating whether or not an event which has occurred during the execution of simulation will be transmitted. When the event propagation flag is off, the content of the event attribute section is determined. When a section indicates the event is preset by user, the event is propagated. Otherwise, the event is skipped. The operator can inject a signal pattern into a node by setting the event propagation flag of the node off and by registering events for that node representing the input signal pattern.

1 Claim, 9 Drawing Sheets

| A | B |
|---|---|
| 0 | 1 |
| 1 | 0 |

| TIME | NODE | SIGNAL VALUE | ATTRIBUTE EVENT |
|---|---|---|---|
| t | A | 1 | SIMULATION EVENT |
| t+1 | B | 0 | SIMULATION EVENT |
| t+2 | B | 0 | USER EVENT |
| t+3 | B | 1 | USER EVENT |

EVENT DRIVEN LOGIC SIMULATOR FOR PARTIAL SIMULATION

BACKGROUND OF THE INVENTION

The present invention relates to a logic simulator for performing logic verifications of circuit models, such as logic gate circuits used in electronic apparatuses including data processing apparatuses.

One example of a logic simulator of this kind according to the prior art is disclosed in "Demand Driven Simulation: BACKSIM" by Steven P. Smith, M. Ray Mercer, Bishop Brock, in Proc. 24TH ACM/IEEE DESIGN AUTOMATION CONFERENCE, pp. 181–187, May, 1987.

In this literature is disclosed the flow chart of event driven simulation performed with a conventional logic simulator.

The terminology used in this event driven simulation will be explained below by quoting from the literature cited.

"A signal connects a gate output to one or more gate inputs, which comprise the fanouts of the signal. The terms signal and output will be used interchangeably. Watched signals or outputs are saved during simulation for analysis by graphical or textual display tools after the run completes. Signal Watch commands specify that all changes to the specified signal during a simulation run are to be recorded for later analysis.

"Input stimuli are triplets, the constituent parts of which are a signal identifier, a new simulation value to be forced on the signal, and a time at which the specified signal is to take this new value. In event driven simulation, input stimuli initiate network activity, resulting in the propagation of changed signal values toward circuit outputs. Also in the event driven algorithm, the time queue is the mechanism by which signal changes that are to occur in the future are stored until it is time for them to be applied. Time queue events hold signal value changes pending on a specific output."

Next will be explained the event driven simulation performed with a conventional logic simulator with a quotation of some paragraphs and reference to FIG. 1 of this literature.

"Input to event driven simulators consists primarily of the circuit representation, input stimuli, and Signal Watch commands."

"Before commencing the main simulation loop, the input stimuli are scheduled into the simulator time queue. Once this task is complete, the main loop is entered, and simulation continues until, at the end of a pass, there are no simulation events remaining in the time queue for application in another iteration. At the top of the main loop, the time queue is examined to determine the earliest simulation time at which a signal change is scheduled. Within the main loop and after the time advance step, there are typically two sub loops: the update loop and the evaluation loop."

"The update loop of event driven simulation consists of three parts. First, an event that was scheduled to occur at the current simulation time (always maintained as a global variable) is removed from the time queue. Second, the specified signal is changed to the new value contained in the event record. And third, the output signal's fanout gates are placed in the evaluation stack to await evaluation in response to this input change. This process continues until there are no more events scheduled to occur at the current simulation time.

"The evaluation loop also consists of three parts. First, a gate identifier is popped off the evaluation stack. Second, the gate is evaluated to determine an output value given the gate's current input state. And third, if this newly calculated value is different from the value presently on the gate output, the change is scheduled into the time queue to occur after the gate's delay time expires. The evaluation loop proceeds until all gates in the stack have been evaluated.

"Of course, much subtlety associated with the implementation of an event driven simulator has been omitted in the interest of simplicity and brevity. However, the basic principles hold.

"In summary, computational effort is expended in event driven simulation as the direct result of changes on inputs to gates. Processing tends to move from gate inputs to outputs and then on to the fanout inputs driven by these outputs. Processing always proceeds monotonically forward in time."

However this logic simulator according to the prior art has the following disadvantages.

First, if any logical error is present in the logic circuit to be simulated, this logical error needs to be corrected to prepare a circuit model again, and this takes much time and manhours.

Second, since no state values can be set directly with respect to the internal elements of the logic circuit to be simulated, simulation cannot be continued, unless the circuit model is modified, in any logic circuit in a later stage than the one in which the logic error has occurred.

SUMMARY OF THE INVENTION

The main object of the present invention, therefore, is to obviate the aforementioned disadvantages and provide a logic simulator with which the efficiency of logical verification of simulation models can be improved and the manhours required for to execute logical verifications can be reduced.

According to the invention, there is provided a logic simulator provided with event storage means for storing the time at which the state value in the node of simulation is to vary, that node, the state value after having varied in that node, and an event attribute which indicates whether or not the event is what the operator preset before the execution of simulation; node information storage means for the state value of said node, the logic which said node has, the node of propagating origin of said node, the node of propagating destination of said node, the delay time which said node has, and an event propagation flag indicating whether or not said event having occurred during the execution of simulation will be transmitted to said propagation node; user event registering means for registering said operator-set event in said event storage means, said event attribute being a user event; event propagation flag setting means for setting in a predetermined state the event propagation flag of said node information storage means corresponding to a node designated by said operator; event read-in means for reading in events registered in said event storage means in a predetermined sequence; node information read-in means for reading in from said node information storage means node information corresponding to the events read in by said event read-in means; event propagation means for registering in said event storage means, on the basis of event information read in by said event read-in means, events to perform a first processing for altering the state value of the node stored in said node information storage means, second processing for finding out the state value of said node of propagating destination by arithmetic operation, and a third processing for altering the state value of that node propagation destination; event attribute determination means for performing a first processing to determine the event attributes of the events read in by said event read-in means, and second processing to start said event propagation means or said event read-in means on the basis of the result of this determination; and event flag determination means for performing a first processing to determine the event propagation flag contained in node information read in by said node information read-in means, and a second processing to start said event propagation means or said event attribute determination means on the basis of the result of this determination.

BRIEF DESCRIPTION OF THE DRAWINGS

The features and advantages of the present invention will become more apparent from the following description when taken in conjunction with the accompanying drawings in which.

In these drawings, the same reference numerals denote respectively the same constituent elements.

DETAILED DESCRIPTION OF THE PREFERRED EMBODIMENT

Next will be described in detail a preferred embodiment of the present invention with reference to drawings.

Figure 1:
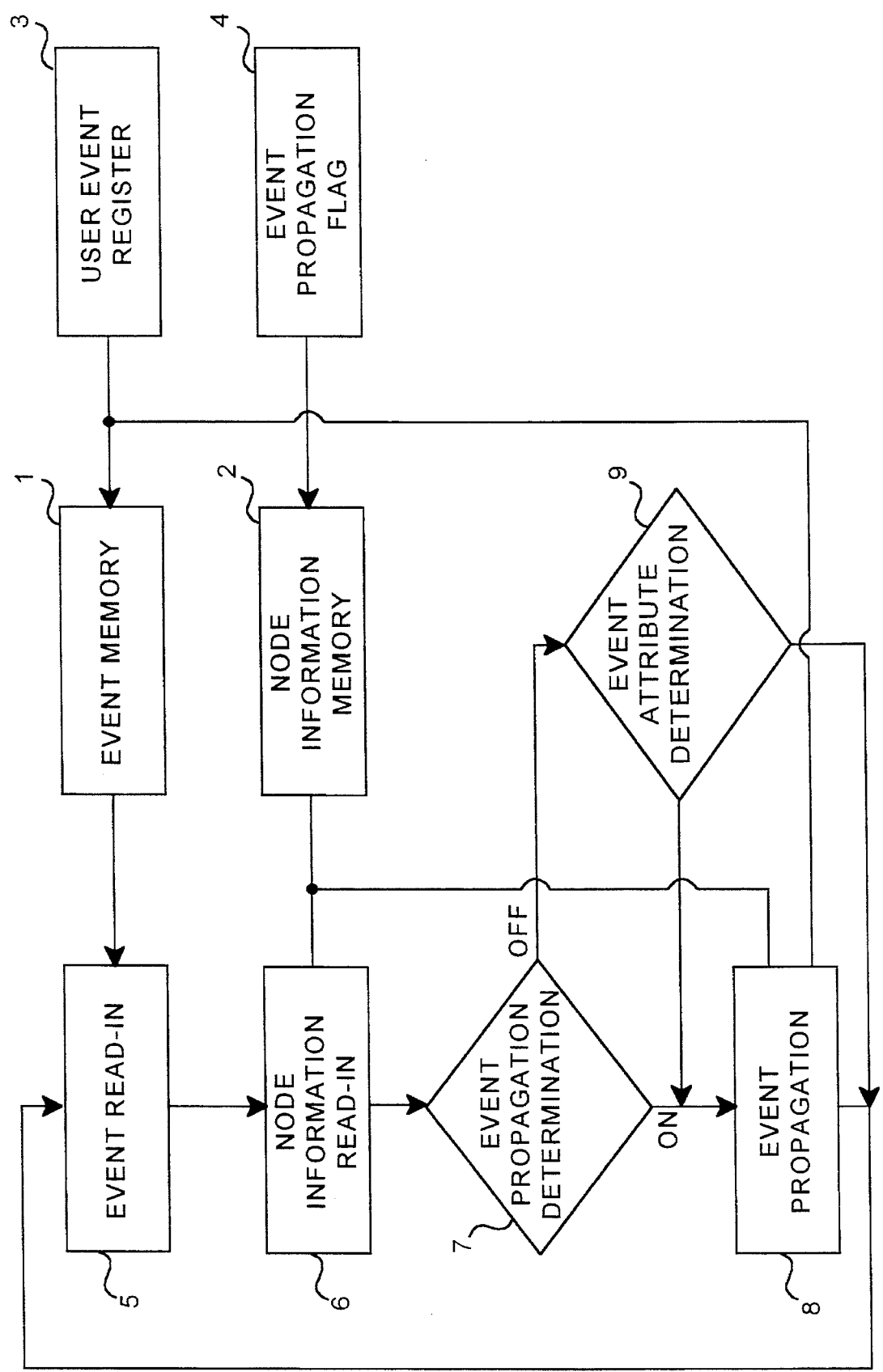
FIG. 1 illustrates the configuration of a logic simulator, which is a preferred embodiment of the invention.

Referring to FIG. 1, a logic simulator, which is a preferred embodiment of the invention consists of event storage means 1, node information storage means 2, user event registering means 3, event propagation flag setting means 4, event read-in means 5, node information read-in means 6, event propagation flag determination means 7, event propagation means 8, and event attribute determination means 9.

Individual constituent elements of this embodiment will be described in further detail below.

Figure 2:
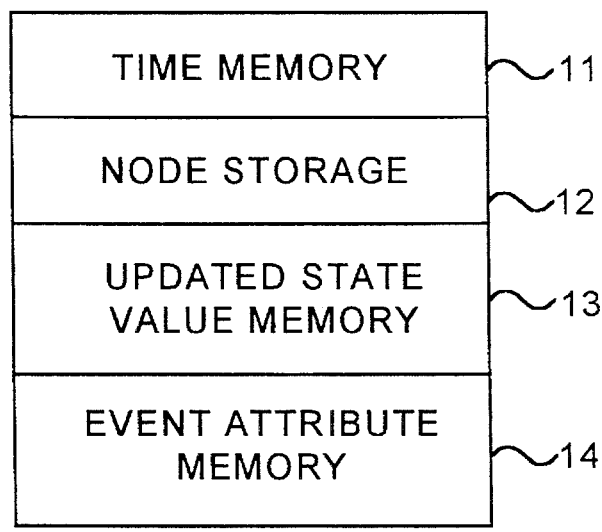
FIG. 2 illustrates the configuration of event storage means in this embodiment.

Referring now to FIG. 2, the event storage means 1 stores information indicating the time at which the state value in the node of simulation currently in execution is to vary, information indicating the node in which simulation is to be executed, information indicating the state value after having varied, and event attribute information indicating whether or not the event to be provided to the node in which simulation is currently being executed is a user event registered by the operator in advance or a simulation event which has occurred, while the simulation is in execution, from the event in the previous stage in a time storage section 11, a node storage section 12, an updated state value storage section 13 and an event attribute storage section 14, respectively.

Figure 3:
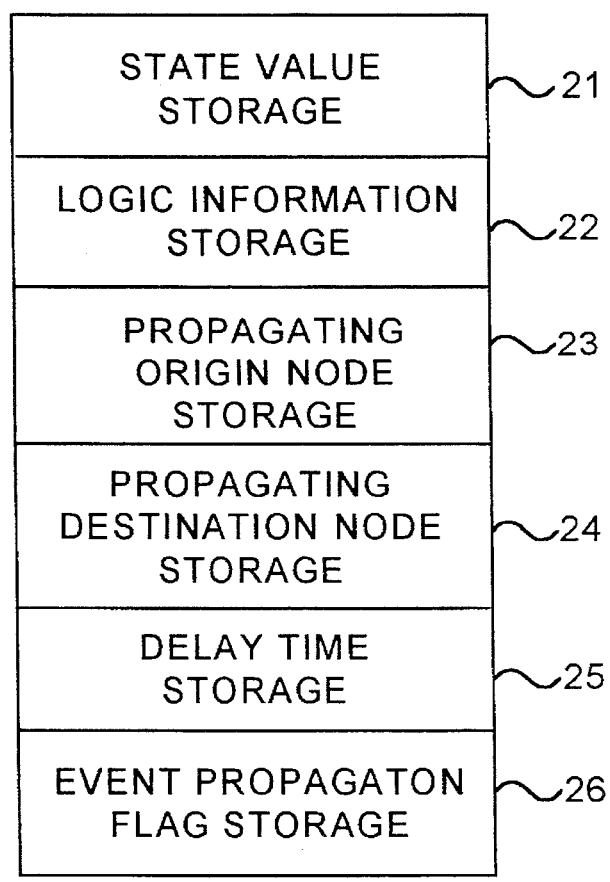
FIG. 3 illustrates the configuration of node information storage means in this embodiment.

Referring to FIG. 3, the node information storage means 2 stores information indicating the state value held by each node present in the simulation model, logic information, information indicating the propagating origin of the node, information indicating the node of propagating destination of the output signal, the delay time of propagation, and an event propagation flag indicating whether or not the event having occurred during the execution of simulation will be transmitted to the node of the next stage in a state value storage section 21, a logic information storage section 22, a propagating origin node storage section 23, a propagating destination node storage section 24, a delay time storage section 25 and an event propagation flag storage section 26, respectively.

Figure 4:
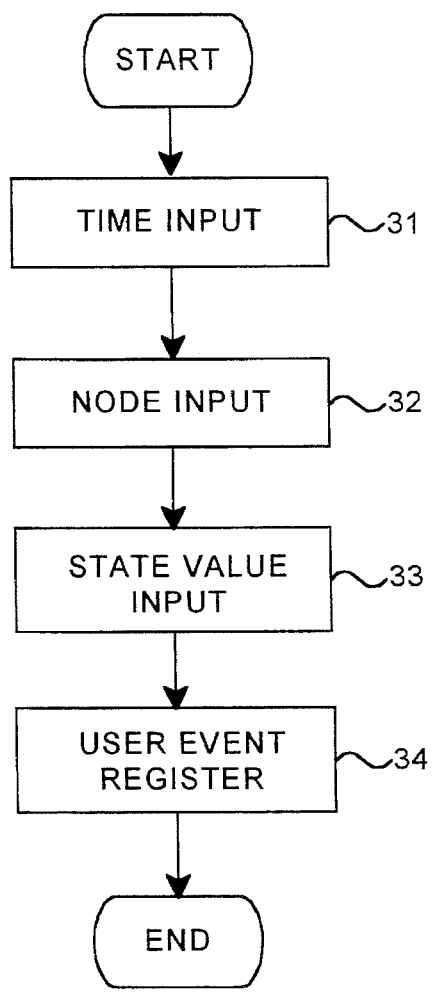
FIG. 4 illustrates the configuration of user event registering means in this embodiment.

Referring to FIG. 4, the user event registering means 3, started by the operator before simulation is actually carried out, performs the following processings.

First, when a time input section 31 is started, the operator enters the time at which the status value is to vary and then, when a node input section 32 is started, enters the node in which to set the state value. Next, when a state value input section 33 is started, the operator enters the state value to be set and then, when a user event registering section 34 is started, registers the time, node and status value of input in the time storage section 11, the node storage section 12 and the updated state storage section 13 in the event storage means 1, further registering in the event attribute storage section 14 information indicating that the event is a user event.

Figure 5:
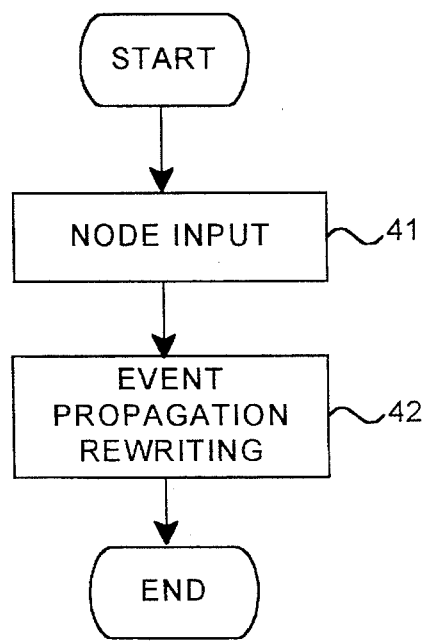
FIG. 5 illustrates the configuration of event propagation flag setting means in this embodiment.

Referring now to FIG. 5, the event propagation flag setting means 4, similarly to the user event registering means 3, is started by the operator, before simulation is actually carried out, to accomplish the following processings.

First, when a node input section 41 is started, the operator enters the node in which to set the status value when simulation is to be performed and then, when an event propagation rewriting section 42 is started, sets an event propagation flag in the event propagation flag storage section 26 of the node information storage means 2 as an "OFF" state.

Figure 6:
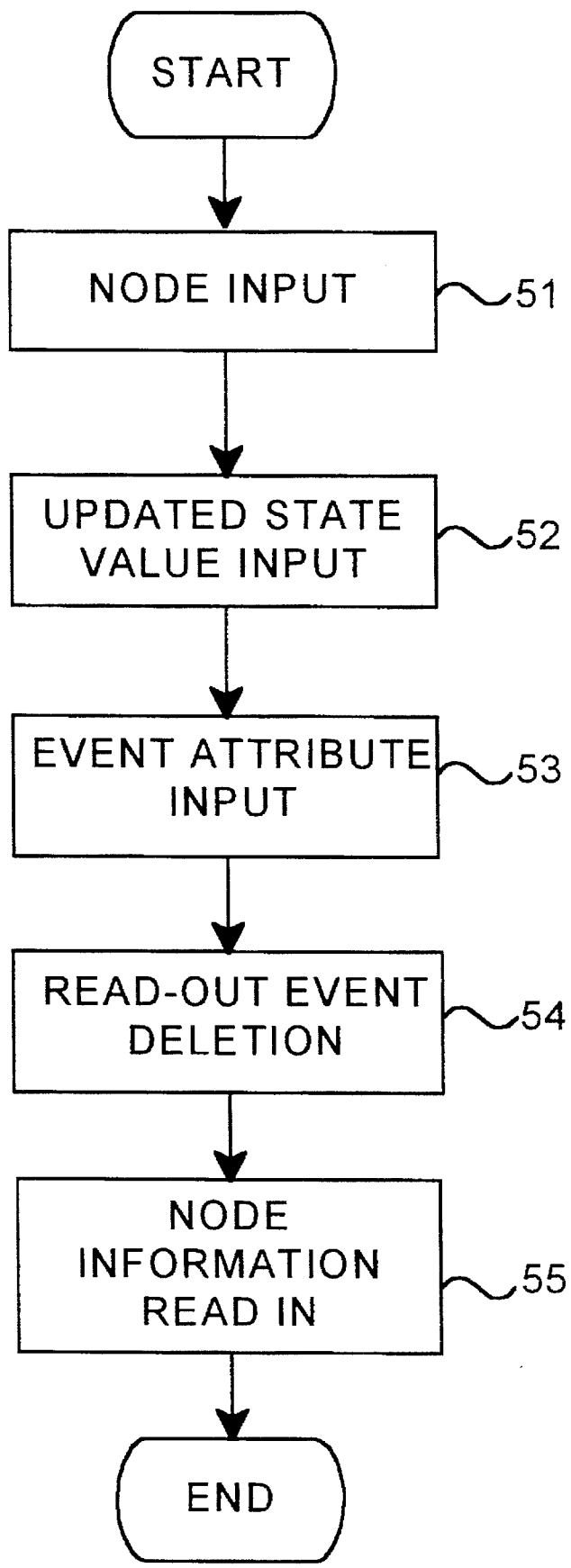
FIG. 6 illustrates the configuration of event read-in means in this embodiment.

Referring to FIG. 6, the event read-in means 5 is started during the execution of simulation, and performs the following processings.

First, the time storage section 11 of the event storage means 1 is searched for the event whose setting time is the earliest among the plurality of events stored in the event storage means 1; a node to alter the status value with respect to this event is read out of the node storage section 12 of the event storage means 1; and a node input section 51 of the event read-in means 5 is started to enter that node. Then, the status value to be newly set is read out of the updated state value storage section 13 of the event storage means 1 and, an updated state value input section 52 being started, entered into this section. Next, event attribute information is read out of the event attribute storage section 14 of the event storage means 1 and, an event attribute input section 53 being started, entered into this section. After the completion of these processings, a read-out event deleting section 54 is started, and the items of information on the read-out event are deleted from the pertinent sections of the event storage means 1. Further, a node information read-in means starting section 55 is started to give a starting instruction to the node information read-in means 6.

Figure 7:
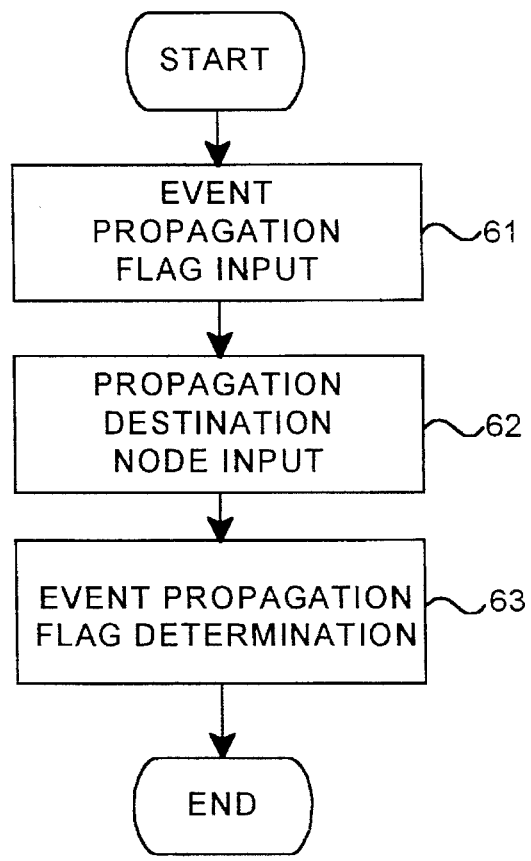
FIG. 7 illustrates the configuration of node information read-in means in this embodiment.

Referring now to FIG. 7, the node information read-in means 6 performs the following processings in response to the starting instruction sent from the event read-in means 5.

First, with respect to the node corresponding to the event read out by the event read-in means 5, an event propagation flag is read out of the event propagation flag storage means 26 of the node information storage means 2 and, an event propagation flag input section 61 being started, entered into this section. Then, information regarding the node of propagating destination is read out of the propagating destination node storage section 24 of the node information storage means 2 and, a propagating destination node input section 62 being started, entered into this section. Further, an event propagation flag determination means starting section 63 is started to give a starting instruction to the event propagation flag determination means 7.

Figure 8:
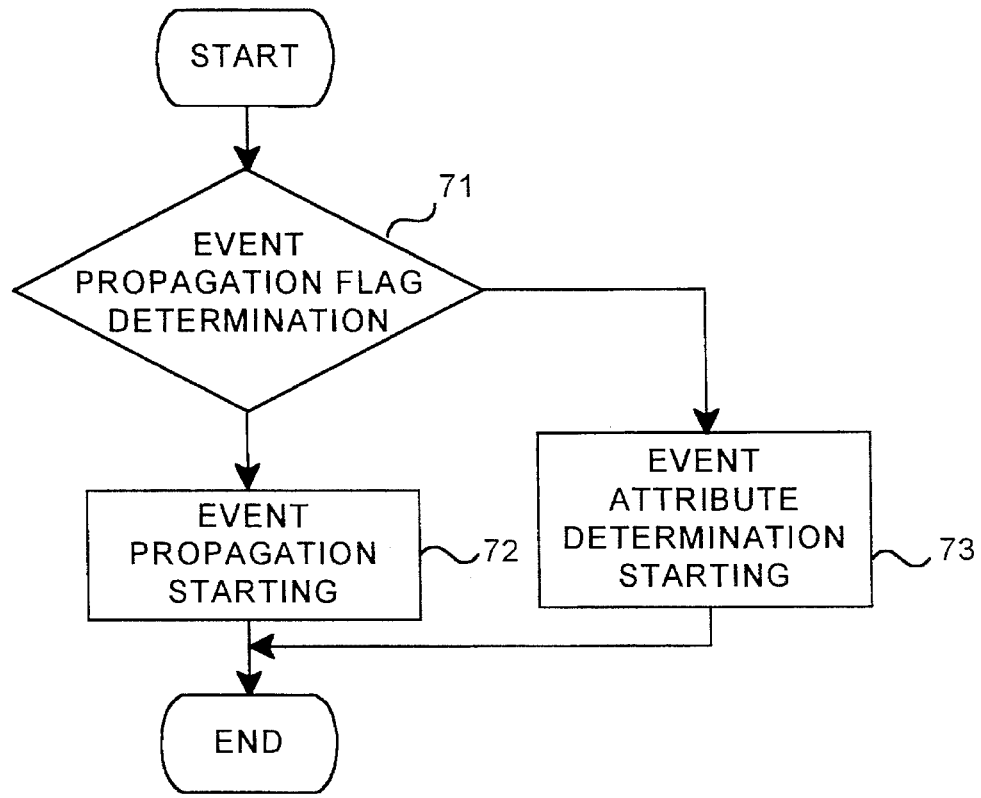
FIG. 8 illustrates the configuration of event propagation flag determination means in this embodiment.

Referring to FIG. 8, the event propagation flag determination means 7 carries out the following processings in response to the starting instruction sent from the node information read-in means 6.

First, an event propagation flag determination section 71 is started, and it is determined whether or not the event propagation flag entered from the event propagation flag storage section 26 of the node information storage means 2 by the event storage flag input section 61 of the node information read-in means 6 is in an "ON" state. If, at this time, the event propagation flag is in an "ON" state, an event propagating means starting section 72 is started to give a starting instruction to the event propagating means 8. Or if the event propagation flag is in an "OFF" state, an event attribute determination means starting section 73 is started to give a starting instruction to the event attribute determination means 9.

Figure 9:
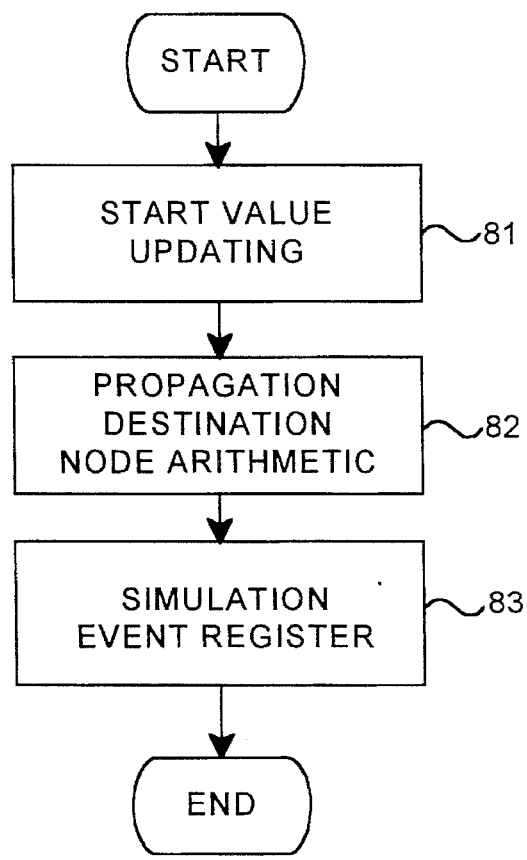
FIG. 9 illustrates the configuration of event propagation means in this embodiment.

Referring to FIG. 9, the event propagating means 8 performs the following processings in response to the starting instruction which is sent when the event propagation flag is determined to be in an "ON" state by the event propagation flag determination means 7.

First, a state value updating section 81 is started, and the status value of the node corresponding to the event read out by the event read-in means 5 is altered. Then, a propagating destination node arithmetic section 82 is started to calculate the status value of the propagating destination node of the node corresponding to this event to arithmetic operation. Further, a simulation event registering section 83 is started to register the items of information on the simulation event corresponding to the propagating destination node in the pertinent storage sections of the event storage means 1.

Figure 10:
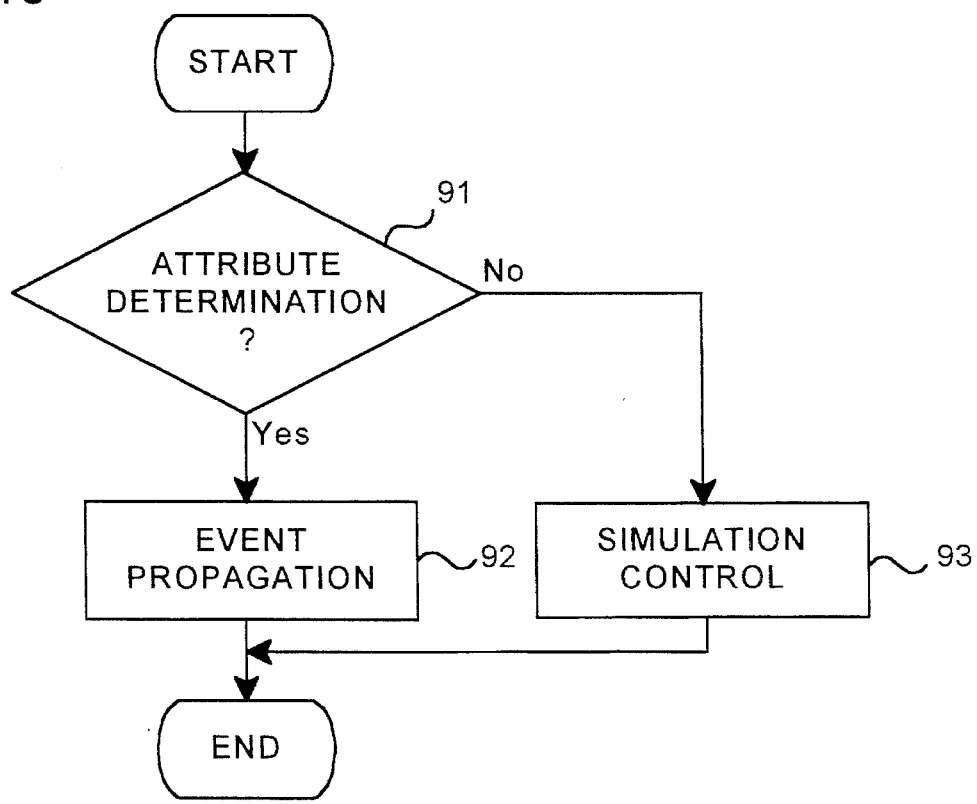
FIG. 10 illustrates the configuration of event attribute determination means in this embodiment.

Referring now to FIG. 10, the event attribute determination means 9 carries out the following processings in response to the starting instruction which is sent when the event propagation flag determination means 7 determines the event propagation flag to be in an "OFF" state.

First, an event attribute determination section 91 is started to determine whether or not the attribute of the event read out by the event read-in means 5 indicates a user event. If, at this time, the event attribute indicates a user event, an event propagating means starting section 92 will be started to give a starting instruction to the event propagating means 8. Or if the event attribute indicates a simulation event, a simulation control means starting section 93 will be started to give a starting instruction to the event read-in means 5.

Figures 11, 12:
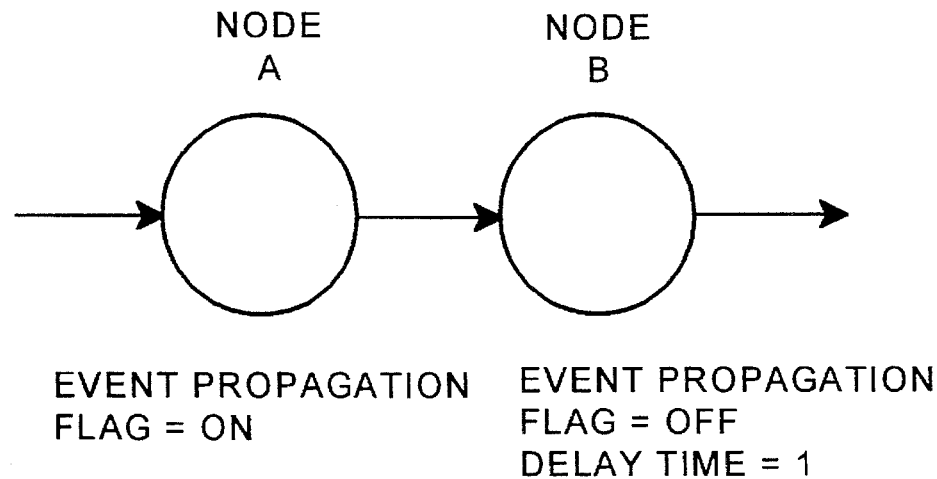
FIG. 11 illustrates an example of simulation model used by the logic simulator according to the invention.
FIG. 12 is a truth table indicating the state values of nodes A and B of the simulation model of FIG. 11.

FIG. 11 illustrates an example of simulation model used to describe the operation of this preferred embodiment. It is supposed here that such items of node information as make the status value 0 with respect to node A or the status value 1 and the delay time 1 with respect to node B are stored in the corresponding storage sections of the node information storage means 2. It is further supposed that the event propagation flag is in an "ON" state for both nodes A and B.

FIG. 12 is a truth table for nodes A and B of the simulation model shown in FIG. 11.

Figures 13, 14:
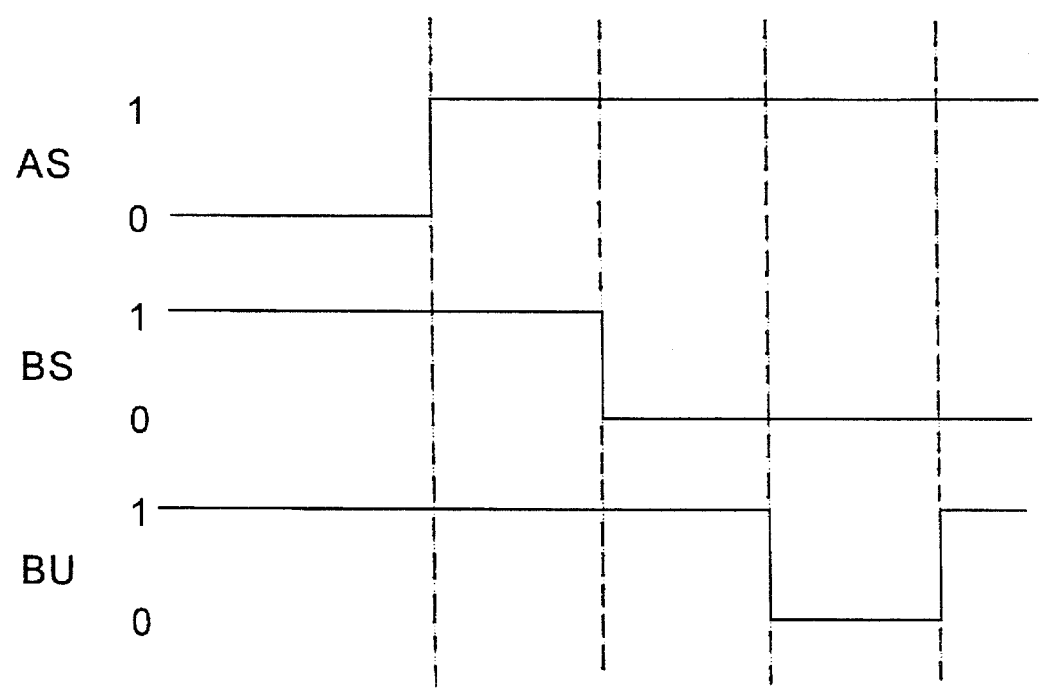
FIG. 13 illustrates an example of event generated by the simulation model of FIG. 11.
FIG. 14 is a waveform diagram of the state values in nodes A and B of the simulation model of FIG. 11.
Figure 15:
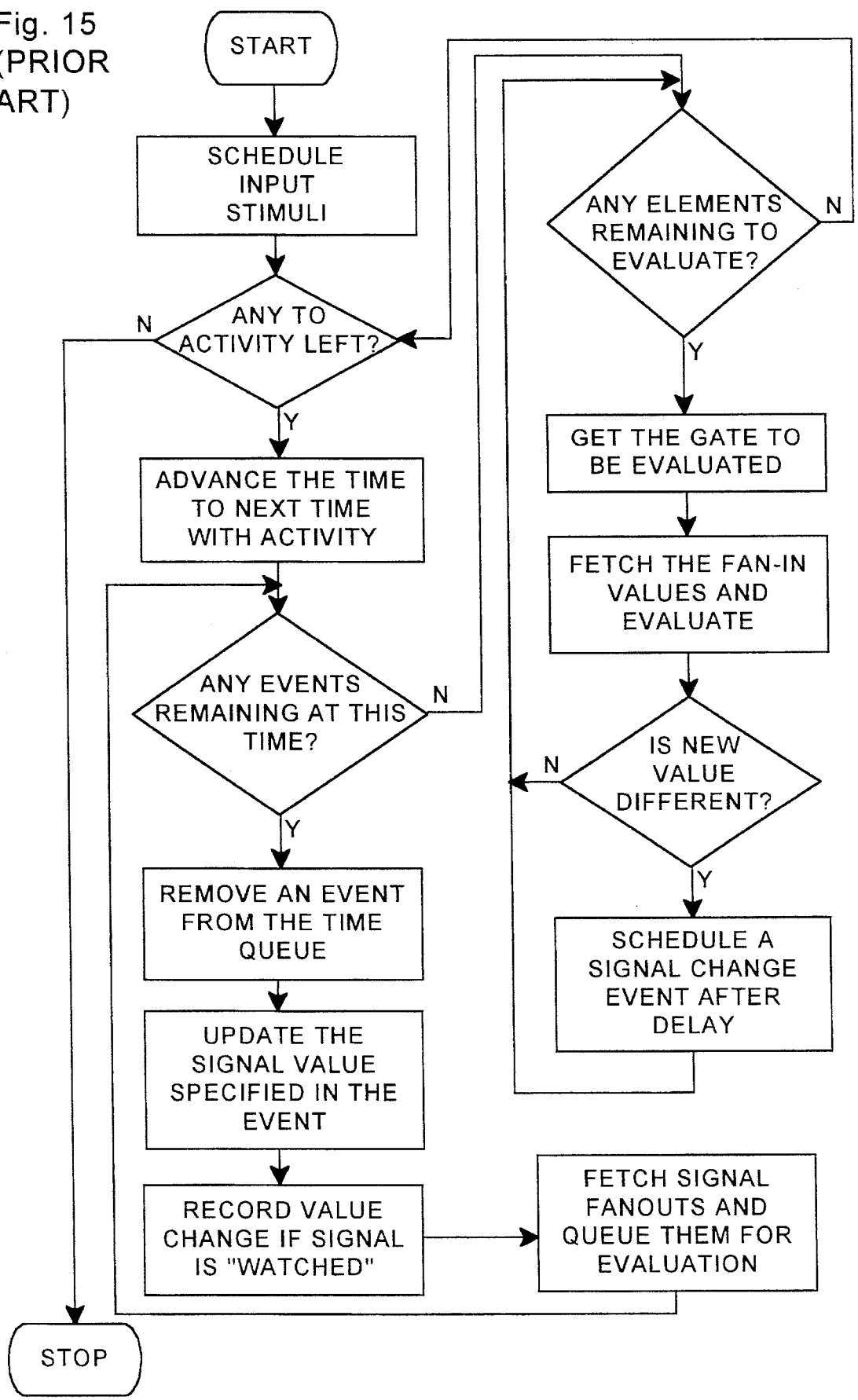
FIG. 15 is a flow chart representing the operation of an event driven logic simulator according to the prior art.

FIG. 13 illustrates an example of event occurring in the nodes A and B of the simulation model shown in FIG. 11. It is supposed here that a simulation event corresponding to node A, represented by an event 131, is stored in the event storage means 1.

FIG. 14 is a waveform diagram of the state values in nodes A and B based on the events shown in FIG. 13. Here, AS is the waveform diagram when a simulation event has occurred in node A; BS, the waveform diagram when a simulation event has occurred in node B; and BU, the waveform diagram when a user event has occurred in node B.

Next will be described in detail the operation of this preferred embodiment with reference to drawings.

First, before executing simulation, the operator starts the user event registering means 3 to register user events represented by events 133 and 134 in FIG. 13 in the event storage means 1. Then he starts the event propagation flag setting means 4 to set the event propagation flag of node B, stored in the node information storage means 2, in an "OFF" state.

Next, as simulation is executed, the event read-in means 5 is started to read out an event 131 of FIG. 13 from the event storage means 1. Then, the node information read-in means 6 is started to read out the event propagation flag of node A corresponding to the event 131 and the propagating destination node from the node information storage means 2. The event propagation flag determination 7, when it is started, checks the event propagation flag of node A, determines that the event propagation flag is in an "ON" state, and gives a starting instruction to the event propagation means 8. The event propagation means 8, as it is started, alters the state value of node A stored in the node information storage means 2 to a state value "1" designated by the event 131. At this time, the state value of node A is altered as illustrated in the waveform diagram AS of FIG. 14. The event propagation means 8 further calculates the state value of node B, which is the propagating destination node of node A, from the state value "1" of node A and the logic of node B based on the truth table of FIG. 12. In this case, the state value of node B becomes "0" and, since the delay time node B is 1, the event 132 of time t+1 is stored into the event storage means 1. The event read-in means 5 is started again, and reads out the event 132 at time t+1. Then the node information read-in means 6, as it is started, reads out the node information of node B corresponding to the event 132. The event propagation flag determination means 7, as it is started, checks the event propagation flag of node B, determines that the event propagation flag is in an "OFF" state, and gives a starting instruction to the event attribute determination means 9. The event attribute determination means 9, as it is started, checks the attribute of the event 132, determines that the event attribute is a simulation event, gives a starting instruction to the event read-in means 5 and, at the same time, inhibits the starting of the event propagation means 8. As a result, the state value of node B in the event 132 remains unchanged, and no propagation of the status value of node B to the propagating destination node takes place either. At this time, the state value of node B is as illustrated by the waveform BS in FIG. 14. Again, the event read-in means 5 is started to read out an event 133 at time t+2 from the event storage means 1. And in the same manner as in the case of the event 132, the processings until that by the event attribute determination means 9 are executed. However, since the attribute of the event 133 is a user event as shown in FIG. 13, the event attribute determination means 9 gives a starting instruction to the event propagation means 8. The event propagation means 8, as it is started, alters the state value of node B stored in the node information storage means 2 to "0" and, at the same time, propagates the state value "0" of node B to the propagating destination node of node B. Next, an event 134 at time t+3 undergoes the same processings as in the case of the event 133. As a result, the state value of node B will become such as illustrated by the waveform BU of FIG. 14, which differs from the waveform BS in the case where the state value is propagated from node A.

Therefore in node B is set only the variation in the state value preset by the operator before the execution of simulation, but the propagation of the status value from node A is ignored.

Since a status value can be set directly for a node in the simulation mode without relying on the state value of the node in the stage preceding this node, a correct value can be inputted to the node having committed a logical error to continue the verification of the simulation model in the later stages of this node.

Furthermore, as a state value can be directly set for the node having committed a logical error, the need to formulate the simulation model all over again from the outset is eliminated, resulting in significant reductions in the time and manhours spent on the logical verification of the simulation model.

While the present invention has been described in conjunction with a preferred embodiment thereof, it will now be readily possible for those skilled in the art to put this invention into practice in various other manners.

What is claimed is:

1. An event driven logic simulator for treating any variation in status values in a node of a simulation model as an event, and performing arithmetic operations only with that node corresponding to that event, comprising:

event storage means for storing relative to a first node a state value which is to vary, a time at which the state value in said first node is to vary, the state value after having varied in said first node, and an operator-set event attribute which indicates whether or not the event is what the operator preset before the execution of simulation;

node information storage means for storing node information, said node information including the state value of a node, a logic function of said node, a node of propagation origin of said node, a node of propagation destination of said node, a delay time which said node has, and an event propagation flag indicating whether or not said event having occurred during the execution of simulation will be transmitted to said propagation destination nodes;

user event registering means for registering said operator-set event attribute in said event storage means;

event propagation flag setting means for setting the event propagation flag of said node information of said node information storage means corresponding to a node designated by said operator;

event read-in means for reading in events registered in said event storage means in a predetermined sequence;

node information read-in means for reading in from said node information storage means said node information corresponding to the events read in by said event read-in means;

event propagation means for registering in said event storage means, on the basis of event information read in by said event read-in means, events to perform a first processing for altering the state value of the node stored in said node information storage means, a second processing for finding out the state value of said node of propagation destination by arithmetic operation, and a third processing for altering the state value of that node propagation destination;

event attribute determination means for performing a fourth processing for starting to give a starting instruction to said event propagation means when said event attribute of the event read in by said event read-in means indicates that the event has been preset before the execution of simulation; and event flag determination means for performing a fifth processing for initiating a starting instruction to said event propagation means when said event propagation flag indicates that an event that has occurred during the execution of simulation should be propagated, and for initiating a starting instruction to said event attribute determination means when said event propagation flag indicates that an event that has occurred during the execution of simulation should not be propagated.

* * * * *